United States Patent
Smovzh

(10) Patent No.: US 7,161,651 B2
(45) Date of Patent: Jan. 9, 2007

(54) METHOD OF RESIZING A LIQUID CRYSTAL DISPLAY

(75) Inventor: Anatoliy Smovzh, Oakville (CA)

(73) Assignee: Luxell Technologies Inc., Mississauga (CA)

(*) Notice: Subject to any disclaimer, the term of this patent is extended or adjusted under 35 U.S.C. 154(b) by 221 days.

(21) Appl. No.: 10/994,791

(22) Filed: Nov. 20, 2004

(65) Prior Publication Data

US 2006/0109416 A1    May 25, 2006

(51) Int. Cl.
*G02F 1/13* (2006.01)
(52) U.S. Cl. .................................... 349/187
(58) Field of Classification Search ............ 349/187, 349/189–190, 158
See application file for complete search history.

(56) References Cited

U.S. PATENT DOCUMENTS

| | | | |
|---|---|---|---|
| 6,204,906 B1 | 3/2001 | Tannas, Jr. | |
| 6,414,741 B1* | 7/2002 | Hasegawa et al. | 349/187 |
| 6,509,949 B1 | 1/2003 | Lu et al. | |
| 6,721,019 B1* | 4/2004 | Kono et al. | 349/12 |
| 7,002,660 B1* | 2/2006 | Watson | 349/187 |
| 2003/0081151 A1* | 5/2003 | Tsuchihashi et al. | 349/61 |
| 2003/0184706 A1* | 10/2003 | Watson | 349/187 |
| 2004/0135941 A1* | 7/2004 | Nam et al. | 349/110 |

FOREIGN PATENT DOCUMENTS

WO    WO 99/19765    4/1999

* cited by examiner

*Primary Examiner*—James A. Dudek
(74) *Attorney, Agent, or Firm*—Fay, Sharpe, Fagan, Minnich & McKee, LLP

(57) ABSTRACT

A method of resizing a liquid crystal display connected to at least one flex board, wherein the liquid crystal display has multiple layers including a liquid crystal layer contained between a pair of glass substrates and a pair of polarizers on opposite sides of respective ones of the glass substrates. The method comprises applying pressure sensitive tape for protecting the polarizers, dicing through the layers, including the polarizers, using a dicing wheel with predetermined diamond particle size to a specified depth and width of groove, cutting through the flex board using a UV laser, breaking off unwanted portions of the liquid crystal display and flex board defined by the dicing and cutting operations, and sealing remaining portions of the liquid crystal display.

6 Claims, 3 Drawing Sheets

METHOD OF RESIZING A LIQUID CRYSTAL DISPLAY

BACKGROUND OF THE INVENTION

1. Field of the Invention

The present invention is directed to liquid crystal displays, and more particularly to a method of resizing a liquid crystal display without first removing the polarizer.

2. Description of the Related Art

Liquid crystal displays (LCDs) are well known in the electronic arts for displaying images and data to a user (e.g. avionics, computer displays, cellular telephones, etc.) A liquid crystal cell is typically provided with two glass substrates having thin transparent ITO (indium tin oxide) layers evaporated on the inner surfaces thereof (referred to herein as the TFT glass and the color filter glass, respectively). Polyimide layers (or any homogenous alignment material such as silane, evaporated silicon monoxide, etc.) are coated on top of the respective ITO layers for aligning the liquid crystal molecules within the cell. Thus, for a left-hand twisted cell, the polyimide layer on the bottom substrate is rubbed along the 0° direction (Cartesian coordinates), while the top polyimide layer is rubbed along the 90° direction (according to the right hand rule in Cartesian coordinates). The glass substrates are bonded together to form a cell using epoxy or thermoplastic material. Next, the cell is filled with liquid crystal by either vacuum filling or by a capillary method. After filling, the cell is sealed and uniform pressure is applied over the cell to improve the uniformity of the cell gap. Bottom and top polarizers are laminated with respective transmission directions perpendicular to the rub directions of the bottom and top polyimide layers. Finally, a reflective layer is deposited on the top polarizer.

Conventional LCDs are available in standard sizes that, in some cases, do not fit the intended application. For example, human factors and space limitations may dictate a smaller than conventional LCD be used for avionics display in the cockpit of an aircraft (military or civilian). Methods are known in the art for resizing LCDs to fit an intended application.

U.S. Pat. No. 6,204,906 (Tannas) discloses a method of changing the physical shape of an electronic display, wherein the display comprises a front plate, a back plate, and a perimeter seal spacing apart the plates, and wherein the image-generating medium is sealed in an area between the plates and within the borders of the perimeter seal. The method comprises cutting the display along desired dimensions, resulting in a target display portion and an excess display portion, thereby breaking the perimeter seal of the display. A seal is applied between the plates along an exposed edge of the target display portion, wherein the seal includes an adhesive having mechanical properties for preserving cell spacing between the front and back plates.

WO 99/19765 (Marconi Avionics (Holdings) Limited) sets forth a method of resizing an LCD having a liquid crystal sealed between first and second parallel transparent plates forming an operative area of the display. In its broadest aspect, the method comprises removing an excess region of the display by cutting through the first and second plates to isolate the excess region of the first and second plates and to expose cut edges along the operative areas of the first and second plates.

U.S. Pat. No. 6,509,949 (Lu et al) sets forth a method of resizing a liquid crystal display comprising the removal of any tape automated bonding strips (TABs) and flex circuits corresponding to undesired portions of the LCD. Any circuit boards, or portions thereof, corresponding to the undesired portion of the LCD are then cut and removed. The display panel is cut to remove a portion of the display panel corresponding to the undesired portion of the LCD and, finally, the cut edge of the display panel is sealed.

Each of the foregoing prior art LCD resizing methods also specifically includes removal of the polarizer before cutting, which adds to the processing costs and time required to resize the display. Also, the prior art is silent on any preferred approach to flex PCB (printed circuit board) cutting.

SUMMARY OF THE INVENTION

It is an aspect of the present invention to provide a method of resizing an LCD that does not require removal of the polarizer before cutting. Another aspect of the invention is to provide flex PCB cutting that minimizes conductor short circuits.

The above aspects can be attained by a method that includes dicing through the polarizer and other LCD layers using a dicing wheel with specified diamond particle size, as well as specified depth and width of groove, followed by UV laser flex PCB cutting.

These together with other aspects and advantages which will be subsequently apparent, reside in the details of construction and operation as more fully hereinafter described and claimed, reference being had to the accompanying drawings forming a part hereof, wherein like numerals refer to like parts throughout.

DETAILED DESCRIPTION OF THE PREFERRED EMBODIMENTS

Figure 1:
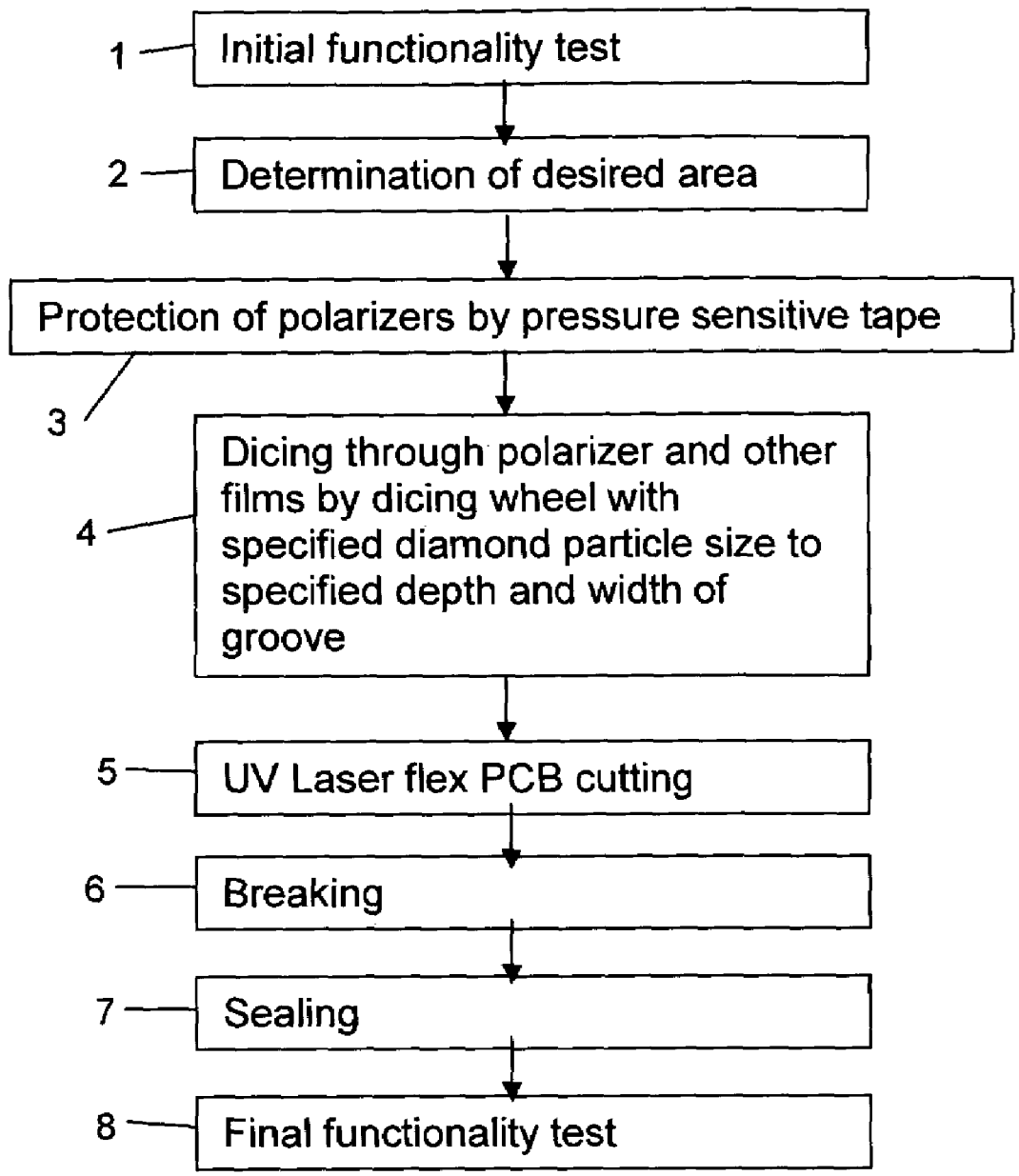
FIG. 1 is a flowchart of a method for resizing an LCD, according to the preferred embodiment.

FIG. 1 is a flowchart showing the steps in a preferred embodiment of the LCD resizing process. First, at step 1, an initial functionality test is performed consisting of illuminating the LCD and verifying optical performance. Next, at step 2, a determination is made as to the desired size of the display, based on the intended application. At step 3, pressure sensitive tape is applied to the tops of both polarizers for protection against glass particles generated during dicing.

Figure 2:
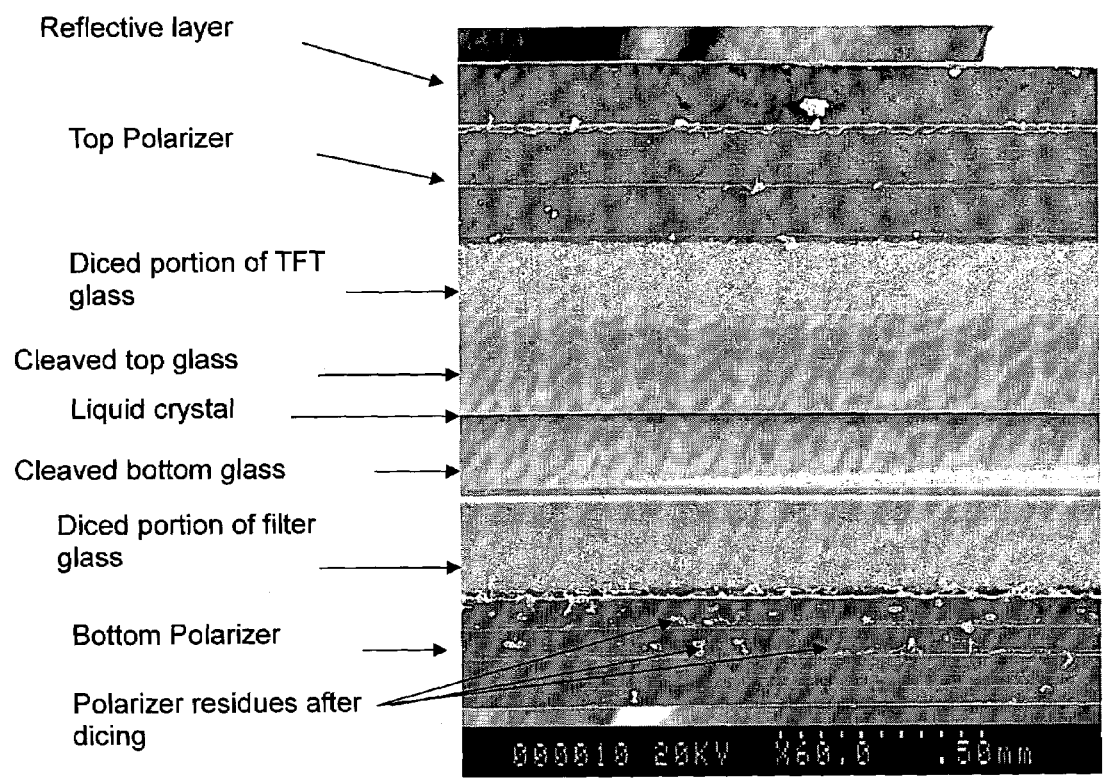
FIG. 2 is scanned electron microscope images of an LCD cut using the method of FIG. 1.

According to an important aspect of the invention, at step 4, a dicing wheel is used to cut through all layers of the LCD, including the polarizers. The result of this cutting operation and consecutive breaking is shown in FIG. 2, discussed in greater detail below. Contrary to the teachings of the prior art, the inventor has discovered that by careful selection of the diamond particle size of the cutting wheel, an appropriate depth and width of the groove are provided which does not damage the polarizers or cause delaminating of the LCD layers, thereby eliminating the prior art requirement of first removing the polarizers.

According to a successful implementation, the cutting step 4 was performed using a K&S 7100 dicing saw with a 10 mils thick diamond wheel. It was determined that diamond particles size should be in range 40–70 microns. The use of lower particle size leads to dicing wheel clogging and overheating of the LCD in the vicinity of the cut. Diamond particles greater than 70 microns give rise to an increase of the chip-out region.

Depth of cutting depends on glass thickness and mechanical properties. It was determined that in order to achieve mechanical rigidity of the diced LCD panel for secure handling and easy breaking, the depth of dicing should be different for the TFT and color filter glass layers of the LCD. This result is achieved under conditions that one of the glasses is diced to 30–40% of glass thickness while the other is diced to 50–60% of glass thickness. The selection of which glass is cut to a greater depth is a purely mechanical consideration.

Next, at step 5, UV laser cutting is performed for trimming the PCB flex board. Normally, flex board is made of PVA materials bearing densely populated narrow (~10 mils) copper conductive lines. A UV laser is used in the preferred embodiment to avoid short circuits due to copper spreading during mechanical trimming (i.e. machining of PVA requires UV irradiation).

At step 6, the sections of unwanted LCD and flex board are broken and separated. In order to facilitate panel separation, it is preferable that the breaking force be applied to the glass having the shallower groove.

The remaining LCD is sealed with UV curable adhesive at step 7. An additional UV curable sealant may also be applied for protection against moisture. A final functionality test is performed at step 8, similar to the initial test discussed above in connect ion with step 1.

Figure 3:
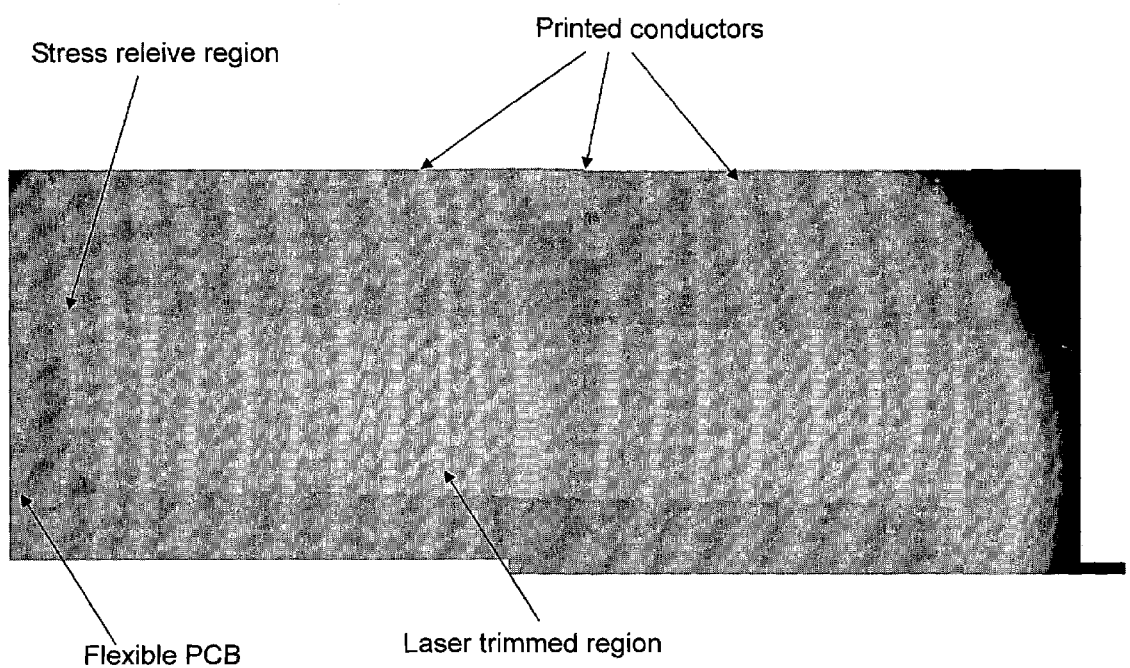
FIG. 3 is a scanned electron microscope image of a flex PCB board trimmed according to the preferred embodiment of FIG. 1.

The results of dicing and breaking of the LCD (steps 4 and 6) are shown in FIG. 2 which depicts a vertical cross-section through the cut LCD, from which there will be noted an absence of polarizer and the other film residues on the diced areas of both glasses. Some polarizer residues are evident sticking to the polarizer. However, the presence of these residues does not affect LCD performance after resizing FIG. 3 is an image of a flex PCB board trimmed using a Spectraphysic® SSDP laser at 5 W power and 246 nm wavelength, according to the preferred embodiment. Resistivity between two adjacent conducting lines after laser trimming was measured in excess of 20 Megaohms.

The many features and advantages of the invention are apparent from the detailed specification and, thus, it is intended by the appended claims to cover all such features and advantages of the invention that fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A method of resizing a liquid crystal display connected to at least one flex board, said liquid crystal display having a liquid crystal layer between a pair of glass substrates and a pair of polarizers on opposites sides of respective ones of said glass substrates, the method comprising:
    applying pressure sensitive tape for protecting said polarizers;
    dicing through said layers, including said polarizers, to a specified depth and width of groove using a dicing wheel of predetermined diamond particle size;
    cutting through said flex board;
    breaking off unwanted portions of said liquid crystal display and flex board defined by said dicing and cutting; and
    sealing remaining portions of said liquid crystal display.

2. The method of claim 1, wherein said predetermined diamond particle size is in the range of 40–70 microns.

3. The method of claim 1, wherein said specified width is approximately 10 mils.

4. The method of claim 1, wherein said specified depth is approximately 30–40% of glass thickness of one of said pair of glass substrates and 50–60% of glass thickness for the other of said pair of glass substrates.

5. The method of claim 4, wherein said breaking off unwanted portions of said liquid crystal display and flex board comprises applying a breaking force to said one of said pair of glass substrates.

6. The method of claim 1, wherein said sealing comprises applying a UV curable adhesive to said remaining portions of said liquid crystal display.

* * * * *